(12) United States Patent  
Rahman

(10) Patent No.: US 7,298,175 B1
(45) Date of Patent: Nov. 20, 2007

(54) LOW LEAKAGE POWER PROGRAMMABLE MULTIPLEXERS

(75) Inventor: Arifur Rahman, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 120 days.

(21) Appl. No.: 11/158,579

(22) Filed: Jun. 22, 2005

(51) Int. Cl.
H03K 19/094 (2006.01)

(52) U.S. Cl. .................................. 326/113; 326/41

(58) Field of Classification Search ............ 326/38–41, 326/113
See application file for complete search history.

(56) References Cited

U.S. PATENT DOCUMENTS

| | | | |
|---|---|---|---|
| 6,278,290 B1 * | 8/2001 | Young | 326/41 |
| 6,373,291 B1 * | 4/2002 | Hamada et al. | 326/113 |
| 6,798,270 B1 * | 9/2004 | Bauer | 327/408 |
| 6,914,449 B2 * | 7/2005 | Kaviani | 326/41 |
| 2002/0141234 A1 * | 10/2002 | Kaviani | 365/181 |

OTHER PUBLICATIONS

Rahman, Arifur et al.; "Evaluation of Low-Leakage Design Techniques for Field Programmable Gate Arrays," FPGA 2004, Feb. 22, 2004, pp. 23-29, Available from Department of Electrical and Computer Engineering, Polytechnic University, Brookly, NY 11201.

V. De et al., "Techniques for Leakage Power Reduction," Design of High Performance Microprocessor Circuits, A Chandrakasan and W. Bowhill, and F. Fox (editors), Wiley-IEEE Press NJ., Chapter 3, Sep. 2000, ISBN 0-7803-6001-X.

K. Roy et al., "Leakage Current Mechanisms and Leakage Reduction Techniques in Deep- Submicrometer CMOS Circuits," Proceedings of the IEEE, vol. 91 (2), pp. 305-327. Feb. 2003.

* cited by examiner

Primary Examiner—Vibol Tan
(74) Attorney, Agent, or Firm—Scott R. Brown

(57) ABSTRACT

An integrated circuit programmable multiplexer that reduces sub-threshold leakage current in deep sub-micron technology. The multiplexer uses a plurality of transistor stages, wherein each transistor of a subsequent stage is connected to at least two transistors of a prior stage, such that each transistor is in series with at least one other transistor. Transistors that are not part of the signal path through the multiplexer are deactivated, wherein a series of two or more deactivated transistors have significantly less sub-threshold leakage current than a single deactivated transistor. Configuration memory cells that store and communicate control signals to the multiplexer transistors are also connected to a low-voltage power supply when the multiplexer is not in use to reduce leakage current through the memory cells.

16 Claims, 7 Drawing Sheets

LOW LEAKAGE POWER PROGRAMMABLE MULTIPLEXERS

FIELD OF THE INVENTION

The present invention relates to reduction in sub-threshold leakage current in deep sub-micron technology and more particularly to the use of transistor stacking in programmable multiplexers to achieve this result in CMOS IC devices.

BACKGROUND

Future electronic systems will continue to require both ever increasing speed and decreasing power consumption. To attain higher speeds and maintain low power consumption, integrated circuit (IC) chips, as one of the principle components of electronic systems, will need to operate at ever higher frequencies while consuming as little power as possible. As device sizes decrease to increase speed and reduce chip size, increased static power consumption will become a major hurdle to attaining low power consumption goals, especially for IC chips manufactured using CMOS technology. Static power consumption is the power consumed by circuits, and more particularly, individual devices that are not actively changing states, i.e., the transistors are in a steady off state. Up until now, static power consumption in CMOS technology has been negligible. But the continued shrinking of device sizes will change this.

Continuing process advancements have allowed for reductions in critical dimensions in CMOS manufacturing. IC device dimensions have now or are about to reach a critical point where static power consumption will become a major concern unless new techniques are implemented to avoid unacceptable static power consumption levels. As device sizes have shrunk there has been a reduction in power supply voltage ($V_{dd}$). While lower $V_{dd}$ corresponds to lower dynamic power consumption, it also reduces the speed of the device. To maintain or increase device speed, efforts have been pursued to reduce the threshold voltage ($V_{th}$) of transistors within a given process. However, the subthreshold voltage current, or leakage current, of a transistor exponentially increases with any $V_{th}$ decrease. At prior larger device dimensions, this exponential leakage current increase was still negligible. But, at current and future device dimension sizes, this exponential increase in leakage current will result in a rapid and noticeable increase in static power consumption. Thus, without employing a new approach, the designer may be required to make unacceptable trade off decisions between speed and power consumption.

To counteract this increasing power consumption problem, it would be possible to increase the voltage threshold level of the transistors; however, this would have negative impacts on the transistor speed or frequency that the device could be used. Furthermore, increasing $V_{th}$ can introduce other problems because of noise margins that must be maintained within the device. It has been found that increasing $V_{th}$ to more than $V_{dd}/3$ will negatively impact the functionality of the device.

As device sizes continue to shrink, this static power consumption issue will become important for the entire semiconductor industry. It is particularly important now for makers of devices such as programmable logic devices (PLDs) that contain large numbers of transistors on a single die that, after programming, may remain in a static off state.

A PLD is an integrated circuit comprised of an array of configurable logic elements (CLEs) surrounded by a general routing matrix (GRM) with multiple input/output ports. In general, PLDs include programming elements such as static random access memory cells (SRAMs), antifuses, EPROMs, Flash cells, or EEPROMS. These memory elements are used to control the functions performed by the CLEs, the routing of signals in the GRM between CLEs and their input/output ports, and also control the functionality of the input/output ports. Recently, PLD makers have trended toward providing a large number of tri-state drivers to support high fan out signals to be routed in the GRM. A PLD is designed to perform any logic function required by a user.

In practice, once a PLD user designs the function to be implemented by the PLD, and the PLD is programmed to perform the function, a large number of the resources available on the PLD are unused. Thus, the PLD may have a large percentage of transistors that are not being used at any given time. XILINX™, a leading manufacturer of PLDs, makes a variety of PLD known as a field programmable gate array (FPGA). Analysis of typical designs used by users of XILINX™ FPGAs shows that anywhere from 60 to 90 percent of the FPGA resources are typically unused. These unused resources are in a static mode and thus as static power consumption increases for a given process the FPGA and PLD in general is likely to see large increases in overall power consumption.

It is desirable then to implement new circuit techniques that will operate at increased speeds and reduce leakage current in static CMOS devices and thereby reduce IC chip power consumption.

SUMMARY

Various embodiments of the present invention solve the above-described problems and provide a distinct advance in the art of integrated circuits. More particularly, embodiments of the present invention relates to integrated circuit multiplexer designs that substantially reduce the amount of sub-threshold leakage current in various multiplexer circuit elements, including deactivated pass transistors and configuration memory cells.

In a first embodiment, the invention involves an integrated circuit with low leakage characteristics, wherein a plurality of first stage circuit elements receive a plurality of signals and selectively communicate one of the signals to a node. A second stage circuit element receives a signal from the node and selectively communicates the signal to an output. A combinatorial logic element decodes control signals and controls the first stage circuit elements, wherein the logic element deactivates the plurality of first stage circuit elements when the second stage circuit element is deactivated by a control signal.

In a second embodiment, the invention involves an integrated circuit multiplexer comprising a first stage and a second stage, wherein the first stage includes a first plurality of transistors for receiving a first plurality of signals and selectively communicating one of the signals to a first node, and a second plurality of transistors for receiving a second plurality of signals and selectively communicating one of the signals to a second node. The second stage includes a first transistor for selectively connecting the first node to an output and a second transistor for selectively connecting the second node to the output.

A combinatorial logic element decodes transistor control signals and selectively communicates a portion of the control signals to the first stage transistors. More particularly, the combinatorial logic element deactivates the first plurality of transistors of the first stage and communicates control signals to the second plurality of transistors of the first stage if the first transistor of the second stage is not activated, and deactivates the second plurality of transistors of the first stage and communicates control signals to the first plurality of transistors of the first stage if the second transistor of the second stage is not activated.

In a third embodiment, the multiplexer includes a memory element for communicating control signals to first stage circuit elements and a second stage circuit element, wherein the memory element is powered by a first power source when the multiplexer is in use, and is powered by a second power source when the multiplexer is not in use.

These and other important aspects of the present invention are described more fully in the detailed description below.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF VARIOUS EMBODIMENTS

Reference will now be made in detail to some embodiments of the present invention, examples of which are illustrated in the accompanying drawings. Wherever possible, the same reference numbers are used throughout the drawings to refer to the same or like parts.

Figure 1:
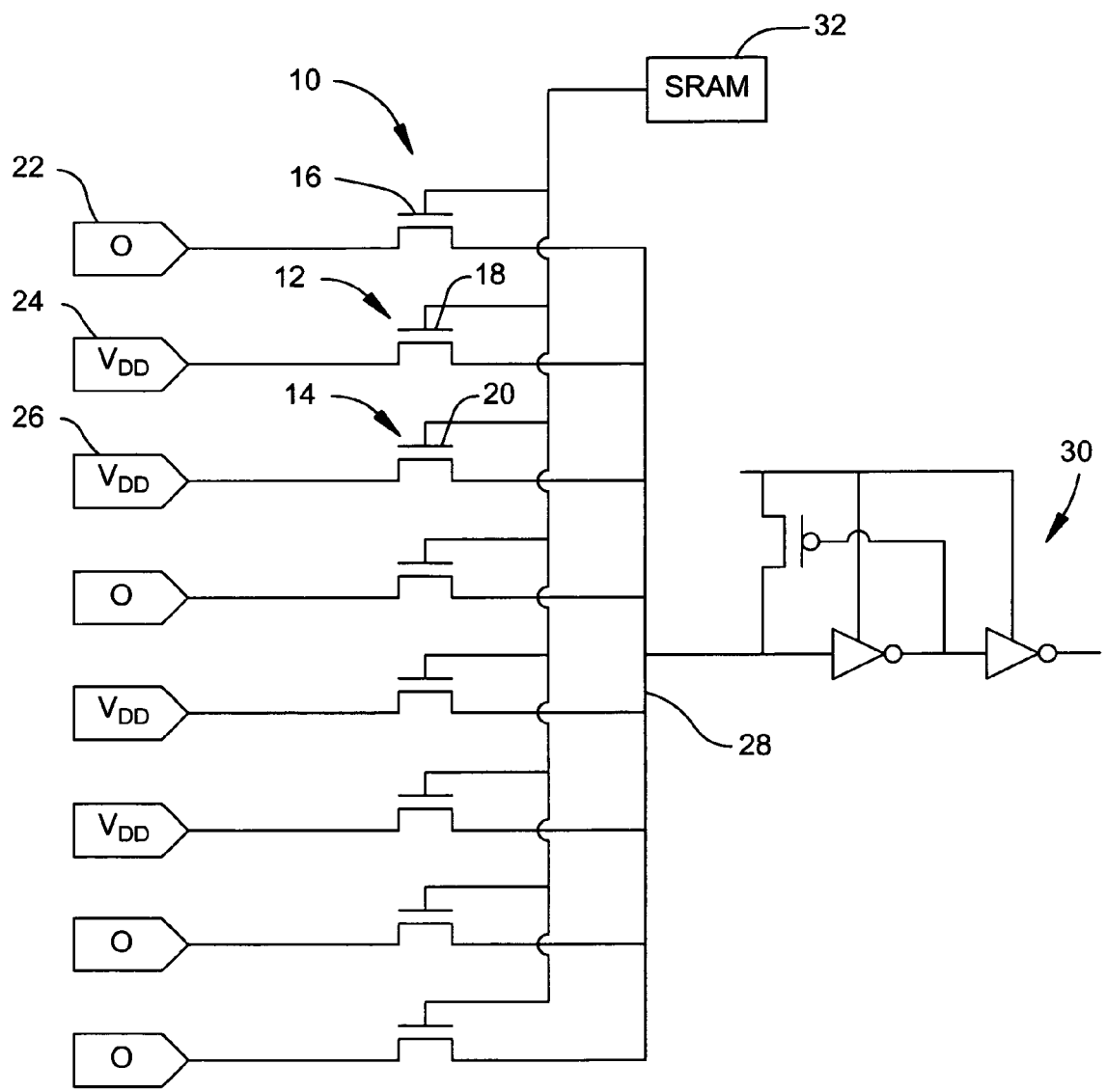
FIG. 1 is a schematic diagram of a prior art multiplexer implemented as part of an integrated circuit.

Referring initially to FIG. 1, an integrated circuit schematic is shown that illustrates a typical integrated circuit (IC) implementation of an eight-by-one multiplexer ("MUX") known in the art. The MUX includes a plurality of pass transistors, such as transistors 10,12,14, wherein each transistor 10,12,14 includes a gate 16,18,20 operable to activate and deactivate the respective transistor 10,12,14. Each transistor 10,12,14 connects a MUX input, such as inputs 22,24,26, to a common node 28, wherein each MUX input 22,24,26 is connected to either a low voltage source ("0" volts), or a high voltage source ("$V_{DD}$"). The common node 28 is connected to an output circuit, such as the buffer circuit 30. The transistor gates 16,18,20 are each connected to an output of a block of static random access memory (SRAM) cells 32, so that each output of the SRAM block 32 activates or deactivates a transistor 10,12,14.

Also referred to as a "configuration SRAM," the SRAM block 32 is manipulated to pass a single input to the common node 28 by activating a single transistor while leaving the remaining transistors deactivated. An example of a configuration SRAM may be found in the configuration memory of a PLD. If the transistor 10 is activated, for example, the input value 22 (0 in this case) is communicated to the common node 28 while the remaining input values are isolated from the common node 28 by their respective deactivated transistors. In the illustrated circuit, the possible input values communicated to the common node 28 may be 0 or $V_{DD}$.

Unfortunately, multiplexers such as that illustrated in FIG. 1 are susceptible of subthreshold leakage current. Transistors that are deactivated, such as transistor 12 in the above example, allow some current to leak from the input 24 to the common node 28 if there is a difference in voltage levels between the input 24 and the common node 28.

Figure 2:
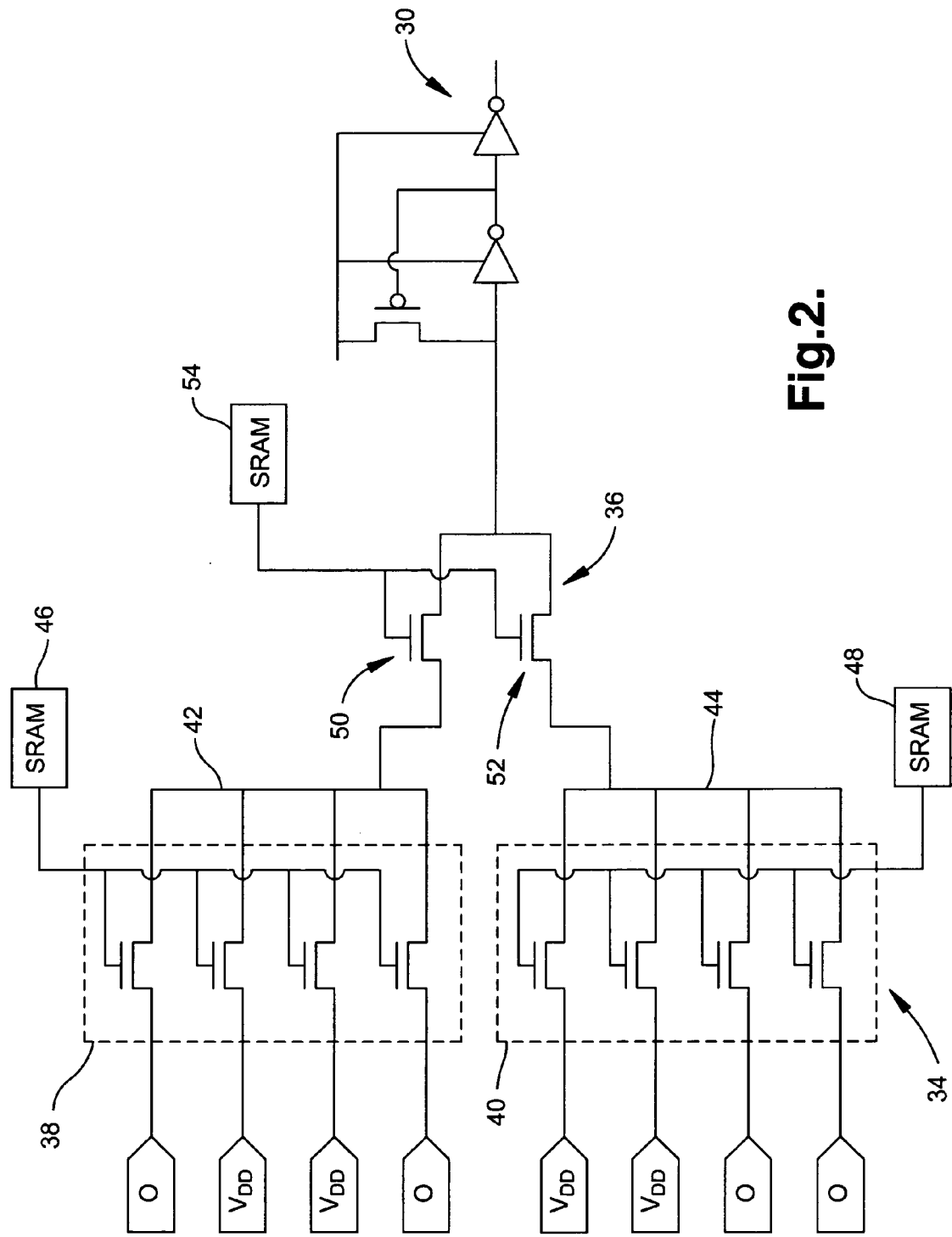
FIG. 2 is a schematic diagram of a first integrated circuit multiplexer embodying principles of the present invention, wherein the multiplexer presents two stages of transistors.

One method of reducing such leakage current is illustrated in FIG. 2, wherein the MUX has been divided into two stages of transistors, a first stage 34 and a second stage 36. The first stage 34 includes two groups of transistors, a first group 38 and a second group 40, wherein each group 38, 40 includes a plurality of transistors. The transistors of the first group 38 connect a first plurality of inputs to a first common node 42, and the transistors of the second group 40 connect a second plurality of inputs to a second common node 44. The transistors of the first group 38 are controlled by a first four-cell memory block 46, and the transistors of the second group 40 are controlled by a second four-cell memory block 48.

The second stage 36 includes two transistors 50,52, wherein a first transistor 50 selectively communicates a signal from the first common node 42 to the buffer circuit 30, and wherein a second transistor 52 selectively communicates a signal from the second common node 44 to the buffer circuit 30. The second stage transistors are controlled by a two-cell memory block 54. The multi-stage MUX of FIG. 2 reduces leakage current by taking advantage of what is known as transistor "stack effect." Stack effect occurs when two or more transistors are placed in series and deactivated, wherein the subthreshold leakage current through the series of two transistors is as much as an order of magnitude less than it would be through a single transistor of the same size.

The stack effect occurs in the circuit of FIG. 2 because one of the two second stage transistors 50, 52 will always be outside of the signal path and thus deactivated. If the signal path through the MUX includes a transistor of the second group 40, for example, the second transistor 52 of the second stage 36 is also activated as part of the signal path. The first transistor 50 of the second stage 36, however, is deactivated along with all of the transistors of the first group 38 of the first stage 34. Thus, each of the transistors of the first group 38 are deactivated and "stacked with" the first transistor 50 of the second stage, greatly reducing leakage current from the $V_{DD}$ inputs of the first group 38 through the transistors. Likewise, when the signal path includes a transistor of the first group 38, the first transistor 50 of the second stage 36 is activated as part of the signal path and the second transistor 52 is deactivated along with all of the transistors of the second group 40 of the first stage 34, thus creating the stack effect.

Figure 3:
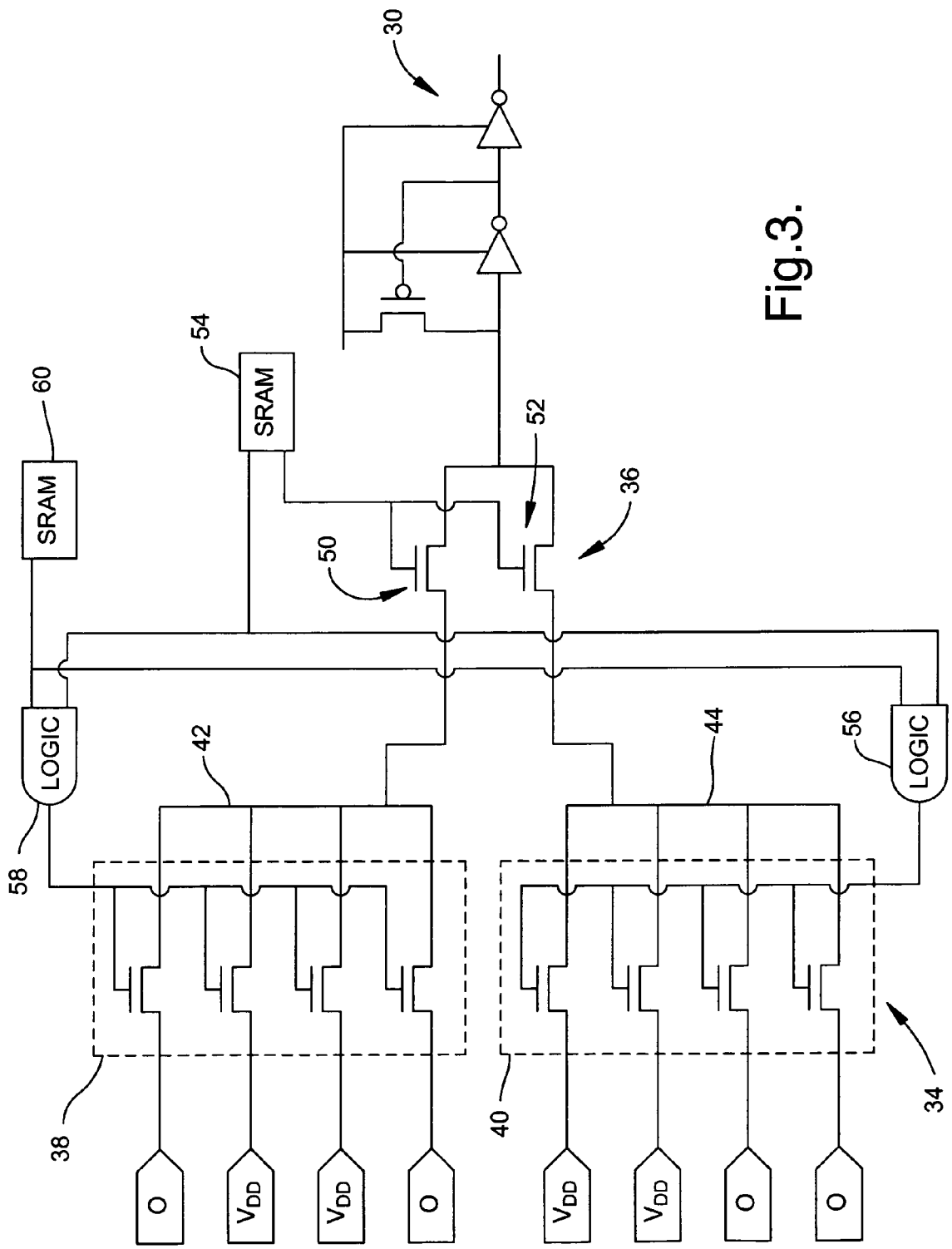
FIG. 3 is a schematic diagram of a second integrated circuit multiplexer embodying principles of the present invention, wherein the multiplexer presents two stages of transistors and various logic elements to decode transistor control signals.

An alternative two-tier MUX circuit design is illustrated in FIG. 3, wherein the circuit of FIG. 3 is similar to the circuit of FIG. 2, except that the two, four-cell memory blocks 46,48 of the circuit of FIG. 2 are replaced with a single four-cell memory block 60 and two logic elements 56,58 in the circuit of FIG. 3. Each of the logic elements 56,58 receives a four-bit control signal from the four-cell memory block 60 as well a two-bit control signal from the two-cell memory block 54 of the second stage 36. Each logic element 56,58 decodes the two-bit control signal to determine whether the first transistor 50 or the second transistor 52 of the second stage 36 is activated. If the first transistor 50 of the second stage 36 is activated, the first logic element 58 passes the four-bit control signal to the transistors of the first group 38, and the second logic element 56 deactivates the transistors of the second group 40. Conversely, if the second transistor 52 of the second stage 36 is activated, the first logic element 58 deactivates the transistors of the first group 38, and the second logic element 56 passes the four-bit control signal to the transistors of the second group 40.

While the logic elements 56,58 have been discussed and shown as separate circuit elements for purposes of illustration, it will be appreciated that the functionality of both elements 56,58 may be implemented in a single combinatorial logic element.

Each logic element 56,58 is preferably entirely combinatorial, or implemented without memory elements of any kind such as flip-flops or other such memory elements. The circuit design embodied in the circuit of FIG. 3, then, reduces the total number of memory cells required to implement the multiplexer. The circuit illustrated in FIG. 3, for example, includes the four-cell memory block 60 and the two-cell memory block 54, thus using a total of six memory cells. The circuit illustrated in FIG. 2, in contrast, includes two four-cell memory blocks 46,48 as well as the two-cell memory block 54, thus using a total of ten memory cells.

Figure 4:
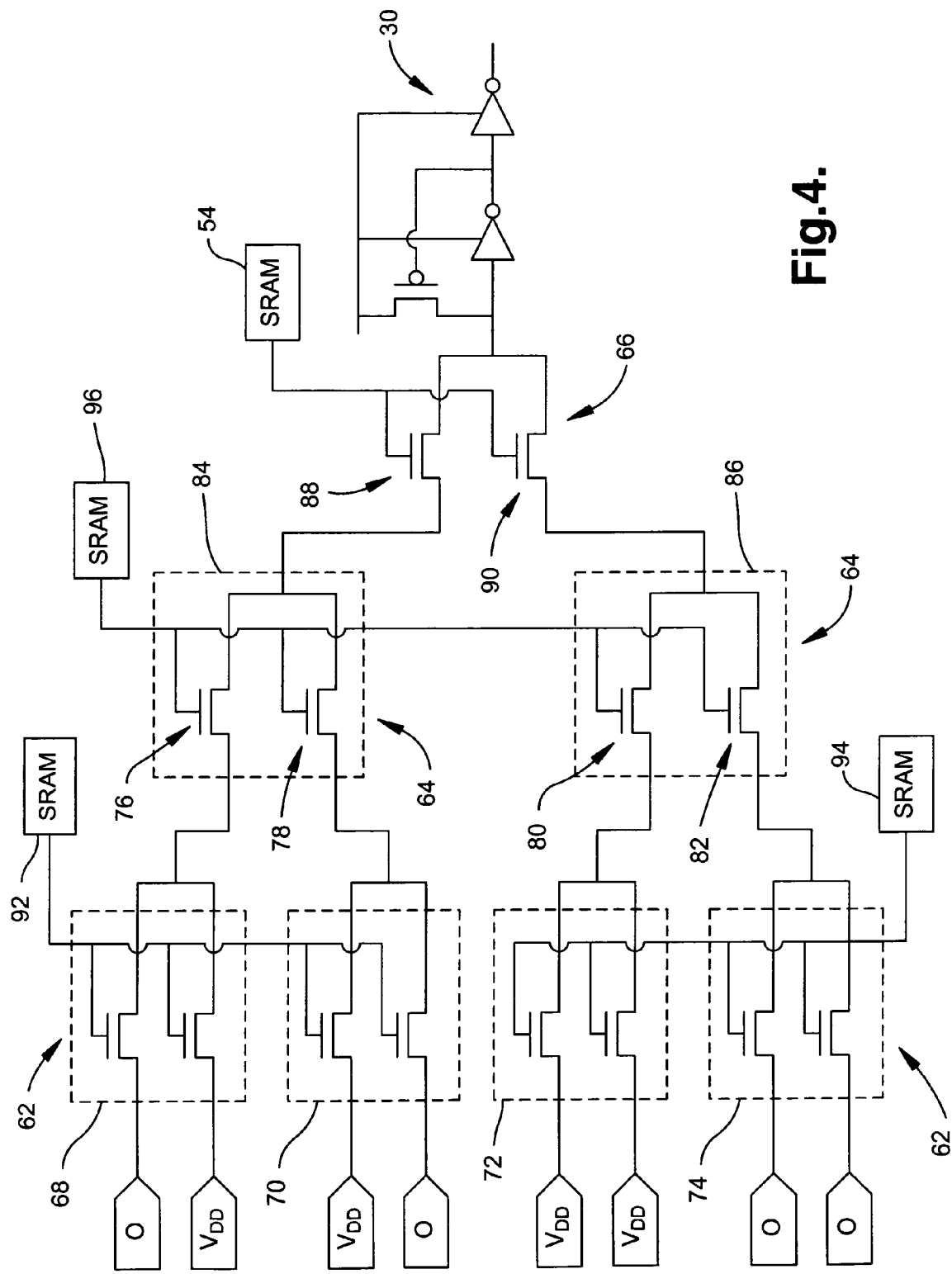
FIG. 4 is a schematic diagram of a third integrated circuit multiplexer embodying principles of the present invention, wherein the multiplexer presents three stages of transistors.

A MUX circuit design which further reduces subthreshold leakage current is illustrated in FIG. 4, wherein the circuit presents three stages 62,64,66 of transistors. A first stage 62 includes eight transistors divided into four groups 68,70,72, 74; a second stage 64 includes four transistors 76,78,80,82 divided into two groups 84,86; and a third stage 66 includes two transistors 88,90. Each group 68,70,72,74 of the first stage 62 is connected to a different transistor 76,78,80,82 of the second stage; and each group 84,86 of transistors of the second stage 64 is connected to a different transistor of the third stage 66. This circuit design includes four configuration memory elements: three four-cell memory blocks 92,94, 96 and one two-cell memory block 54.

The three-stage design of FIG. 4 enables more deactivated transistors to benefit from the stack effect than the two-stage design of FIG. 3, thus further reducing leakage current through deactivated transistors. This design augments the stack effect in two ways: first, three deactivated transistors can be stacked in series instead of two. Second, a greater portion of transistors not in a signal path can be deactivated.

To illustrate, if a transistor of the fourth group 74 of the first stage 62 of transistors is activated, the fourth transistor 82 of the second stage 64 and the second transistor 90 of the third stage 66 would also be activated as part of the signal path to communicate the input signal to the buffer circuit 30. All transistors of the first group 68 and the second group 70 of the first stage 62, as well as all transistors of the first group 84 of the second stage 64 and the first transistor 88 of the third stage 66 are deactivated. Thus, all transistors that are connected either directly or indirectly to the first transistor 88 of the third stage 66 are deactivated, resulting in a series of three stacked transistors between the first stage 62 and the third stage 66. Stacking the transistors three deep in this manner reduces subthreshold leakage current by as much as two or three orders of magnitude.

Furthermore, a portion of the transistors connected directly or indirectly to the second transistor 90 of the third stage 66 are also deactivated. For example, both transistors of the third group 72 of the first stage 62, as well as the third transistor 80 of the second stage 64, are deactivated and thus benefit from the stack effect. Thus, the stack effect can be used for six of the eight inputs, and three-deep stacking can be used for four of the eight inputs. In the circuit of FIG. 3, by comparison, only four of the eight inputs could be stacked at any give time, and only two transistors could be placed in series.

Figure 5:
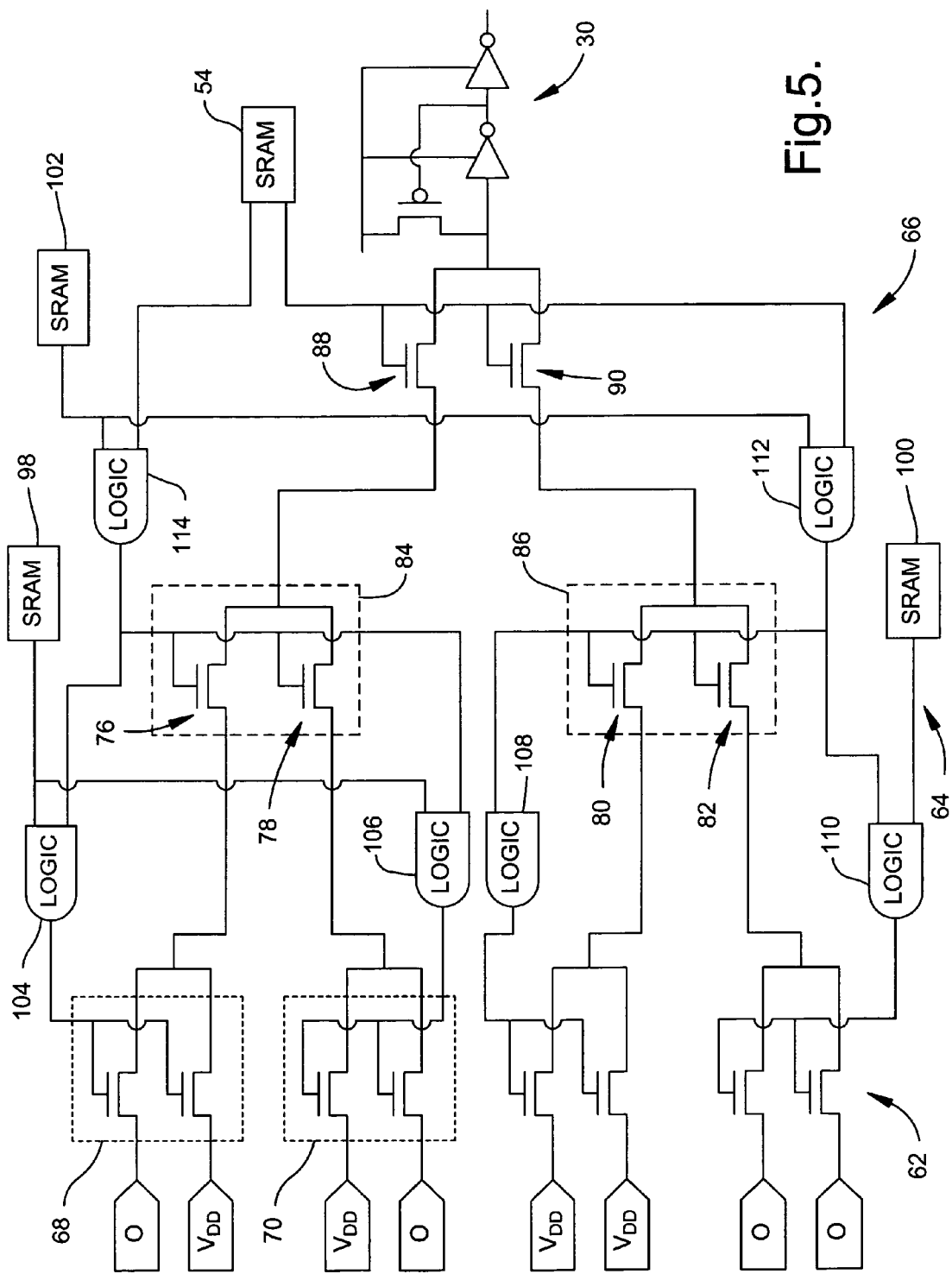
FIG. 5 is a schematic diagram of a fourth integrated circuit multiplexer embodying principles of the present invention, wherein the multiplexer presents three stages of transistors and various logic elements to decode transistor control signals.

An alternative implementation of a three-stage MUX circuit is illustrated in FIG. 5. The circuit of FIG. 5 is similar to the circuit of FIG. 4, except that the four-cell memory blocks 92,94,96 of FIG. 4 are replaced by two-cell memory blocks 98,100,102 and a plurality of logic elements 104, 106,108,110,112,114. The circuit of FIG. 5 functions similarly to the circuit of FIG. 4 in that all transistors in the second stage 64 and the third stage 66 are deactivated except for those that form part of the signal path. In contrast to the circuit of FIG. 4, however, the circuit of FIG. 5 does not employ fully-decoded control signals, but rather uses the logic elements to decode a portion of the control signals. The circuit of FIG. 4, for example, uses a four-cell memory block 96 to control the four transistors 76,78,80,82 of the second stage 64 of the circuit. The same transistors 76,78,80,82 of the circuit of FIG. 5 are controlled by a two-cell memory block 102 and the two-cell memory block 54 that controls the transistors 88,90 of the third stage 66, wherein the logic elements 112,114 decode the control signal from the memory block 54 to determine which of the third stage transistors 88,90 is activated.

By way of example, the memory block 102 outputs a two-bit control signal that is communicated either to the first group 84 or the second group 86 of transistors of the second stage 64, depending on which of the third stage transistors 88,90 is activated. If the first transistor 88 is activated, the logic element 114 communicates the control signals from the memory block 102 to the first group of transistors 84, and the logic element 112 deactivates the second group of transistors 86. If the second transistor 90 is activated, the logic element 114 deactivates the first group of transistors 84, and the logic element 112 communicates the control signals from the memory block 102 to the second group of transistors 86.

The first group 68 and second group 70 of transistors of the first stage 62 are controlled by logic elements 104 and 106, respectively, in a manner similar to the first and second groups 84,86 of the second stage 64. The logic elements 104,106, however, are each controlled by a two-cell memory block 98 and logic element 114. If the first transistor 76 of the second stage 64 is activated, logic element 104 communicates the control signals from the memory block 98 to the first group of transistors 68, and the logic element 106 deactivates the second group of transistors 70. If the second transistor 78 of the second stage 64 is activated, logic element 104 deactivates the first group of transistors 68, and logic element 106 communicates the control signals from the memory block 98 to the second group of transistors 70. The remaining transistors are operated in a similar manner.

The circuit of FIG. 5 is advantageous in that it requires fewer configuration memory elements than the circuit of FIG. 4. While the circuit illustrated in FIG. 4 includes three four-cell memory blocks 92,94,96 and one two-cell memory block 54 for a total of fourteen memory cells, the circuit illustrated in FIG. 5 includes four two-cell memory blocks 54,98,100,102 for a total of eight memory cells.

Figure 6:
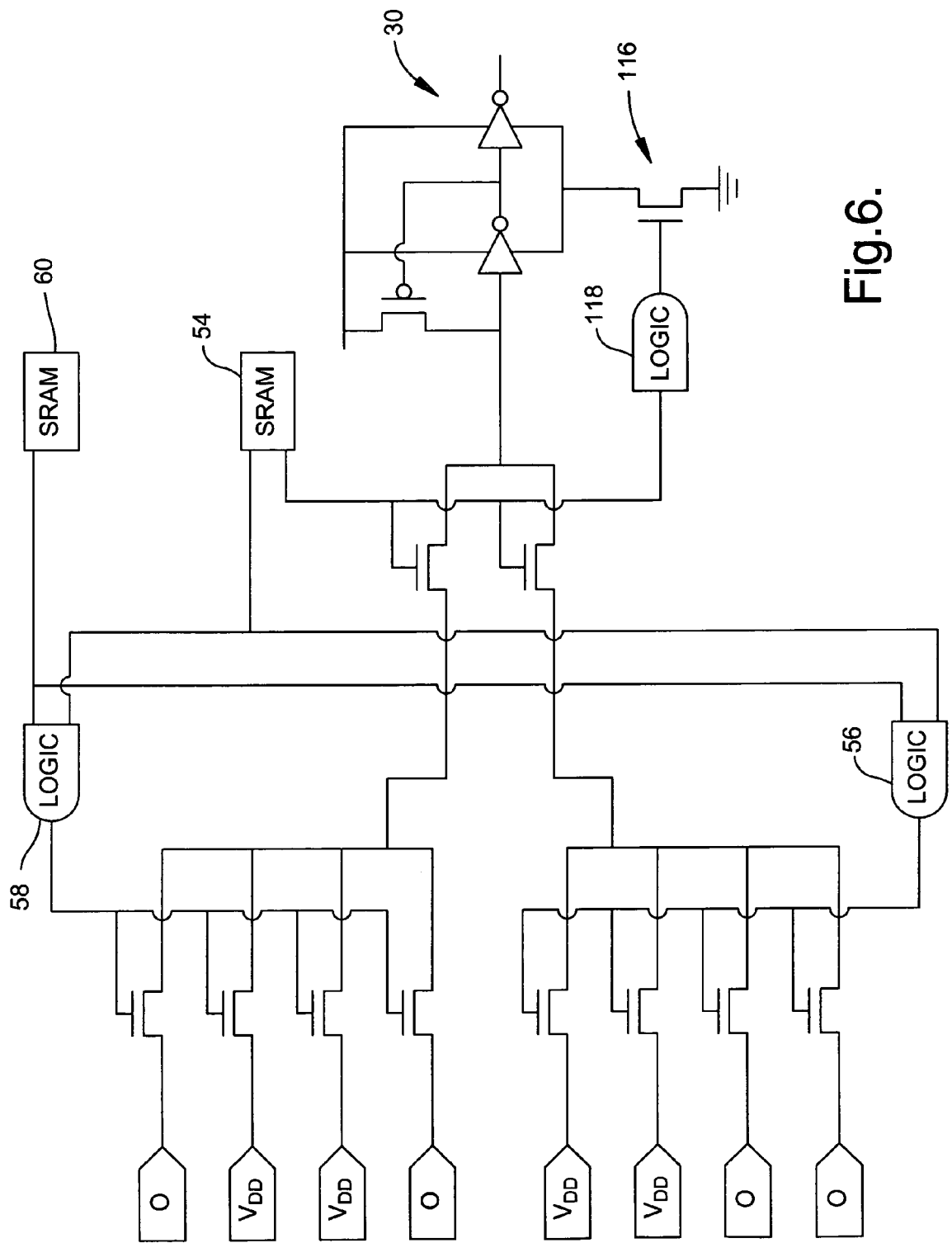
FIG. 6 is a schematic diagram of a fifth integrated circuit multiplexer embodying principles of the present invention, wherein the multiplexer presents two stages of transistors as well as a power-gated buffer circuit.

FIG. 6 illustrates another aspect of the present invention for reducing subthreshold leakage current. The circuit of FIG. 6 is similar to the circuit of FIG. 3, therefore only the differences between the two will be explained in detail. The MUX circuit of FIG. 6 includes a power-gating transistor 116 for power gating one or more elements of the buffer circuit 30, and a logic element 118 for controlling the power-gating transistor 116. The power-gating transistor 116 reduces leakage current in buffer circuit 30, which does not benefit from transistor stacking in the MUX, by isolating the buffer circuit 30 from either a voltage source or a ground when the MUX is not used.

The logic element 118 controls the power-gating transistor 116 by communicating a signal to a gate of the transistor 116. As illustrated, the signal communicated to the gate of the transistor 116 is a function of the two-bit control signal from the memory block 54. The transistor 116 may be deactivated, for example, when the logic element 118 determines that the control signal from the memory block 54 deactivates both second stage transistors. It will be appreciated that power gating may be implemented in any of the buffer circuits disclosed herein.

Figure 7:
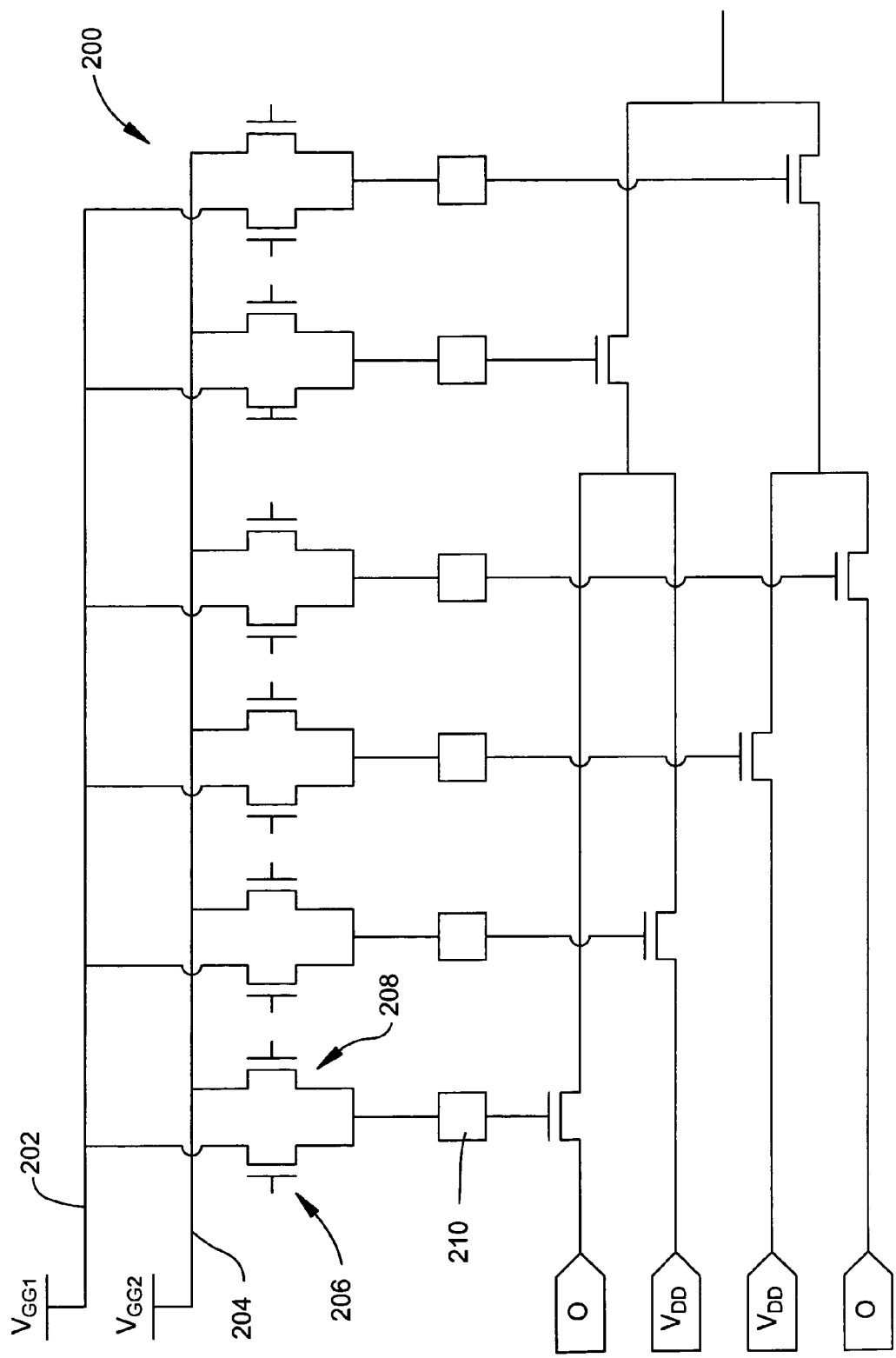
FIG. 7 is a schematic diagram of a sixth integrated circuit multiplexer embodying principles of the present invention, wherein configuration memory elements are selectively connected to one of two power supply voltage sources.

FIG. 7 illustrates yet another aspect of the present invention for reducing subthreshold leakage current. FIG. 7 illustrates a portion of a MUX circuit wherein each cell of one or more configuration memory blocks are shown individually, such as memory cell 210. The above-described methods of reducing leakage current do not address leakage current that may occur in circuit elements of the memory blocks. Thus, FIG. 7 illustrates a circuit design for reducing leakage current in configuration memory blocks by selectively connecting a lower-power voltage supply to memory cells in mulitplexers not in use.

To illustrate operation of the circuit of FIG. 7, reference will now be made to a first memory cell 210 and accompanying transistors 206,208, with the understanding that all memory cells and accompanying transistors operate in a substantially identical manner. When the circuit is in use, the cell 210 is powered by a first voltage source 202 by activating transistor 206 to connect the source 202 to the cell 210 and deactivating transistor 208 to isolate the cell 210 from a second voltage source 204. When the circuit is not in use, the cell 210 is powered by the second voltage source 204 by activating transistor 208 to connect the source 204 to the cell 210 and deactivating transistor 206 to isolate the cell 210 from a first voltage source 202.

The first voltage source carries a voltage equal to $V_{GG1}$, while the second voltage source carries a voltage equal to $V_{GG2}$. If $V_{GG2}$ is significantly less than $V_{GG1}$, the voltage supplied to the memory cell 210 is significantly less while the circuit is not in use. Thus, leakage current through the block of memory cells may be drastically reduced while the circuit is not in use. This method may be used in combination with other aspects of the present invention.

Other aspects and embodiments of the present invention will be apparent to those skilled in the art from consideration of the specification and practice of the invention disclosed herein. It is intended that the specification and disclosed embodiments be considered as examples only, with a true scope and spirit of the invention being indicated by the following claims.

What is claimed is:

1. An integrated circuit comprising:
    a first plurality of first stage circuit elements for receiving a first plurality of signals and selectively communicating one of the signals to a first node;
    a first second stage circuit element for receiving a signal from the first node and selectively communicating the signal to an output; and
    a combinatorial logic element for decoding control signals and controlling the first stage circuit elements, wherein the combinatorial logic element deactivates the first plurality of first stage circuit elements when the first second stage circuit element is deactivated by a control signal to reduce leakage current.

2. The integrated circuit as set forth in claim 1, wherein the first stage circuit elements include a plurality of transistors, and the first second stage circuit element includes a transistor.

3. The integrated circuit as set forth in claim 2, further comprising:
    a second plurality of first stage transistors for receiving a second plurality of signals and selectively communicating one of the second plurality of signals to a second node; and
    a second transistor of the second stage for receiving a signal from the second node and selectively communicating the signal to the output.

4. The integrated circuit as set forth in claim 3, wherein the combinatorial logic element deactivates the second plurality of transistors of the first stage if the second transistor of the second stage is deactivated.

5. The integrated circuit as set forth in claim 4, further comprising a memory element of a PLD for storing and communicating the control signals.

6. The integrated circuit as set forth in claim 4, further comprising a third stage transistor for receiving a signal from the second stage transistors and selectively communicating the signal to the output.

7. The integrated circuit as set forth in claim 1, further comprising a power-gated output element connected to the output.

8. The integrated circuit as set forth in claim 7, further comprising a logic element for controlling the power-gated output element, wherein the logic element deactivates a power-gating transistor of the output element when the second stage circuit element is deactivated.

9. The integrated circuit as set forth in claim 1, wherein the control signals are stored by a memory element, and wherein the memory element is powered by a first voltage source while the circuit is in use, and is powered by a second voltage source while the circuit is not in use.

10. An integrated circuit multiplexer comprising:
    a first stage including—
        a first plurality of transistors for receiving a first plurality of signals and selectively communicating one of the signals to a first node, and
        a second plurality of transistors for receiving a second plurality of signals and selectively communicating one of the signals to a second node;
    a second stage including a first transistor for selectively connecting the first node to an output and a second transistor for selectively connecting the second node to the output; and
    a combinatorial logic element for reducing leakage current, the combinatorial logic element operable to decode transistor control signals, to deactivate the first plurality of transistors of the first stage and communicate control signals to the second plurality of transistors of the first stage if the first transistor of the second stage is not activated, and to deactivate the second plurality of transistors of the first stage and communicate control signals to the first plurality of transistors of the first stage if the second transistor of the second stage is not activated.

11. The multiplexer as set forth in claim 10, further comprising:
   a power-gated output element connected to the output; and
   a logic element for controlling the power-gated output element, wherein the logic element deactivates a power-gating transistor of the output element when the first transistor and the second transistor of the second stage are deactivated.

12. The integrated circuit as set forth in claim 10, wherein the control signals are stored by a memory element, and wherein the memory element is powered by a first voltage source while the multiplexer is in use, and is powered by a second voltage source while the multiplexer is not in use.

13. The integrated circuit as set forth in claim 10, further comprising a third stage transistor for receiving a signal from the second stage transistors and selectively communicating the signal to the output.

14. An integrated circuit multiplexer comprising:
   a plurality of first stage circuit elements for receiving a plurality of signals and selectively communicating one of the signals to a first node;
   a second stage circuit element for receiving a signal from the node and selectively communicating the signal to an output; and
   a memory element for storing control signals to the first stage circuit elements, wherein the memory element is powered by a first power source when the multiplexer is in use, and is powered by a second power source when the multiplexer is not in use to reduce leakage current.

15. The multiplexer as set forth in claim 14, further comprising:
   a first transistor for selectively connecting the memory element to the first power source; and
   a second transistor for selectively connecting the memory element to the second power source.

16. The multiplexer as set forth in claim 14 wherein the memory element is part of a programming logic device (PLD).

* * * * *